US012010884B2

(12) United States Patent
Song et al.

(10) Patent No.: US 12,010,884 B2
(45) Date of Patent: Jun. 11, 2024

(54) ORGANIC LIGHT-EMITTING DISPLAY SUBSTRATE HAVING PARTITION WALL IN BRIDGE AREA AND MANUFACTURING METHOD THEREOF, AND ORGANIC LIGHT-EMITTING DISPLAY DEVICE

(71) Applicant: BOE TECHNOLOGY GROUP CO., LTD., Beijing (CN)

(72) Inventors: Zunqing Song, Beijing (CN); Pinfan Wang, Beijing (CN); Fangxu Cao, Beijing (CN); Huijuan Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 786 days.

(21) Appl. No.: 16/975,293

(22) PCT Filed: Nov. 6, 2019

(86) PCT No.: PCT/CN2019/115960
§ 371 (c)(1),
(2) Date: Aug. 24, 2020

(87) PCT Pub. No.: WO2021/087803
PCT Pub. Date: May 14, 2021

(65) Prior Publication Data
US 2022/0328593 A1 Oct. 13, 2022

(51) Int. Cl.
*H10K 59/131* (2023.01)
*H10K 50/844* (2023.01)
(Continued)

(52) U.S. Cl.
CPC ......... *H10K 59/131* (2023.02); *H10K 50/844* (2023.02); *H10K 71/00* (2023.02); *H10K 59/1201* (2023.02)

(58) Field of Classification Search
CPC .. H10K 59/131; H10K 59/1201; H10K 71/00; H10K 50/844
(Continued)

(56) References Cited

U.S. PATENT DOCUMENTS

| 10,050,093 B2 | 8/2018 | Jeong et al. |
| 10,121,844 B2 | 11/2018 | Park et al. |

(Continued)

FOREIGN PATENT DOCUMENTS

| CN | 109920803 A | 6/2019 |
| CN | 109935621 A | 6/2019 |

(Continued)

*Primary Examiner* — Eric W Jones
(74) *Attorney, Agent, or Firm* — DINSMORE & SHOHL LLP

(57) ABSTRACT

Provided is an organic light-emitting display substrate and a manufacturing method thereof, and an organic light-emitting display device. The organic light-emitting display substrate includes a display area and an opening area located at the display area. The display area includes: a base substrate; a partition pattern layer located on one side of the base substrate and including a partition wall around the opening area, the partition wall including a wall portion and a blocking portion located on one side of the wall portion away from the base substrate, an orthographic projection of the blocking portion on the base substrate covering and having an area greater than that of the wall portion on the base substrate; and an organic evaporation layer located on one side of the partition pattern layer away from the base substrate, the organic evaporation layer is discontinuous by being blocked by the partition wall.

15 Claims, 5 Drawing Sheets

(51) Int. Cl.
*H10K 71/00* (2023.01)
*H10K 59/12* (2023.01)

(58) Field of Classification Search
USPC .................................................. 257/40, 59
See application file for complete search history.

(56) References Cited

U.S. PATENT DOCUMENTS

| | | | |
|---|---|---|---|
| 2004/0090178 | A1 | 5/2004 | Chuang |
| 2005/0116232 | A1* | 6/2005 | Kim .................... H01L 27/1288 257/E27.111 |
| 2006/0046334 | A1* | 3/2006 | Yamazaki .............. H10K 50/17 438/151 |
| 2017/0148856 | A1* | 5/2017 | Choi .................... H10K 50/844 |
| 2017/0244061 | A1* | 8/2017 | Jin ...................... H10K 50/8426 |
| 2018/0046221 | A1 | 2/2018 | Choi et al. |
| 2018/0114825 | A1* | 4/2018 | Hong ................... H10K 59/124 |
| 2019/0140044 | A1 | 5/2019 | Park et al. |
| 2019/0288234 | A1* | 9/2019 | Kim .................... H10K 50/844 |
| 2021/0028388 | A1* | 1/2021 | Jiang ................... H10K 59/87 |
| 2021/0135159 | A1* | 5/2021 | Senoo ................. H10K 50/844 |
| 2021/0376290 | A1* | 12/2021 | Zhang .................. H10K 50/82 |

FOREIGN PATENT DOCUMENTS

| | | |
|---|---|---|
| CN | 109935730 A | 6/2019 |
| CN | 110246984 A | 9/2019 |
| CN | 110265583 A | 9/2019 |

\* cited by examiner

ORGANIC LIGHT-EMITTING DISPLAY SUBSTRATE HAVING PARTITION WALL IN BRIDGE AREA AND MANUFACTURING METHOD THEREOF, AND ORGANIC LIGHT-EMITTING DISPLAY DEVICE

CROSS-REFERENCE TO RELATED APPLICATIONS

The present application is a U.S. National Stage Application under 35 U.S.C. § 371 of International Patent Application No. PCT/CN2019/115960, filed on Nov. 6, 2019, the disclosure of which is incorporated by reference herein in its entirety.

TECHNICAL FIELD

The present disclosure relates to an organic light-emitting display substrate and a manufacturing method thereof, and an organic light-emitting display device.

BACKGROUND

With the characteristics such as small weight, flexibility, low power consumption, wide color gamut, and high contrast, the organic light-emitting display device is listed as a next-generation display device with promising development prospect. When a display substrate of the organic light-emitting display device is manufactured, an organic light-emitting device (for example, an OLED device) is generally encapsulated by a thin film encapsulating technology to prevent water and oxygen from entering and eventually causing failure of the organic light-emitting device.

How to improve the encapsulating performance of the organic light-emitting display substrate and prolong the service life of the organic light-emitting display device has always been a technical problem to be solved by those skilled in the art.

SUMMARY

According to one aspect of the embodiments of the present disclosure, provided is an organic light-emitting display substrate, comprising a display area and an opening area located at the display area, wherein the display area comprises: a base substrate; a partition pattern layer located on one side of the base substrate and comprising a partition wall disposed around the opening area, wherein the partition wall comprises a wall portion and a blocking portion located on one side of the wall portion away from the base substrate, an orthographic projection of the blocking portion on the base substrate covers an orthographic projection of the wall portion on the base substrate, and an area of the orthographic projection of the blocking portion on the base substrate is greater than an area of the orthographic projection of the wall portion on the base substrate; and an organic evaporation layer located on one side of the partition pattern layer away from the base substrate, wherein the organic evaporation layer is discontinuous by being blocked by the partition wall.

In some embodiments, the display area comprises a plurality of island areas spaced by the opening area, and a bridge area connected between adjacent island areas of the plurality of island areas, wherein each of the plurality of island areas is provided with a pixel area, and the bridge area is provided with a trace area, and both sides of the partition wall are spaced from the pixel area and the trace area respectively.

In some embodiments, the partition wall further comprises a base portion located on one side of the wall portion close to the base substrate, and in a cross section of the partition wall passing through a center of the opening area and perpendicular to the base substrate, the base portion, the wall portion and the blocking portion form an I-shaped structure.

In some embodiments, a material of the base portion is titanium, a material of the wall portion is aluminum, and a material of the blocking portion is titanium.

In some embodiments, the partition wall further comprises a support portion connected to a surface of the blocking portion away from the wall portion.

In some embodiments, the base substrate is a flexible substrate, and comprises an organic body layer and an inorganic barrier layer that are stacked, and the partition pattern layer is disposed on a surface of the inorganic barrier layer away from the organic body layer.

In some embodiments, the organic evaporation layer is a non-patterned organic evaporation layer.

In some embodiments, the pixel area is provided with an organic light-emitting device, and the organic evaporation layer comprises a non-patterned functional layer of the organic light-emitting device.

In some embodiments, the pixel area is further provided with a pixel circuit located on one side of the organic light-emitting device close to the base substrate, and comprising a thin film transistor device and a capacitive device, the pixel circuit comprising: a buffer layer, an active layer of the thin film transistor device, a first insulating layer, a first metal layer, a second insulating layer, a second metal layer, a third insulating layer, a third metal layer and a planarization layer that are sequentially disposed along a direction away from the base substrate, wherein the first metal layer comprises a gate of the thin film transistor device and a first electrode plate of the capacitive device, the second metal layer comprises a second electrode plate of the capacitive device, and the third metal layer comprises a source and a drain that are connected to the active layer through via holes.

In some embodiments, the trace area is provided with a trace and a trace covering layer located on one side of the trace away from the base substrate.

According to another aspect of the embodiments of the present disclosure, provided is an organic light-emitting display device, comprising the organic light-emitting display substrate according to any one of the above embodiments.

According to still another aspect of the embodiments of the present disclosure, provided is a manufacturing method of an organic light-emitting display substrate, the organic light-emitting display substrate comprising a display area and an opening area located at the display area, the manufacturing method comprising: a partition pattern layer, on one side of a base substrate, comprising a partition wall disposed around the opening area, wherein the partition wall comprises a wall portion and a blocking portion located on one side of the wall portion away from the base substrate, an orthographic projection of the blocking portion on the base substrate covers an orthographic projection of the wall portion on the base substrate, and an area of the orthographic projection of the blocking portion on the base substrate is greater than an area of the orthographic projection of the wall portion on the base substrate; and forming an organic evaporation layer on one side of the partition pattern layer away from the base substrate, wherein the organic evaporation layer is discontinuous by being blocked by the partition wall.

In some embodiments, the display area comprises a plurality of island areas spaced by the opening area, and a bridge area connected between adjacent island areas of the plurality of island areas, wherein each of the plurality of island areas is provided with a pixel area, and the bridge area is provided with a trace area; and forming the partition pattern layer on the one side of the base substrate comprises: forming the partition wall, on the one side of the base substrate, disposed around the opening area and both sides of which are spaced from the pixel area and the trace area respectively.

In some embodiments, the partition wall further comprises a base portion located on one side of the wall portion close to the base substrate, and in a cross section of the partition wall passing through a center of the opening area and perpendicular to the base substrate, the base portion, the wall portion and the blocking portion form an I-shaped structure; and forming the partition pattern layer on the one side of the base substrate comprises: forming a partition wall prefabricated line by dry etching on the one side of the base substrate, wherein the partition wall prefabricated line comprises a titanium layer, an aluminum layer and a titanium layer that are sequentially disposed along a direction away from the base substrate; or the partition wall prefabricated line comprises a molybdenum layer, an aluminum layer and a molybdenum layer that are sequentially disposed along the direction away from the base substrate, and wet etching the partition wall prefabricated line to form the I-shaped structure of the partition wall.

In some embodiments, the pixel area is provided with an organic light-emitting device, and the I-shaped structure of the partition wall is formed in a wet etching process forming an anode of the organic light-emitting device.

In some embodiments, before the I-shaped structure of the partition wall and the anode of the organic light-emitting device are formed, the manufacturing method further comprises: forming an inorganic barrier layer on a surface of an organic body layer to form the base substrate; forming a buffer layer, an active layer of a thin film transistor device, a first insulating layer, a first metal layer, a second insulating layer, a second metal layer and a third insulating layer sequentially on one side of the base substrate where the inorganic barrier layer is provided, wherein the buffer layer, the first insulating layer, the second insulating layer and the third insulating layer are spread over the plurality of island areas and the bridge area, the active layer, the first metal layer and the second metal layer are located at the pixel area, the first metal layer comprises a gate of the thin film transistor device and a first electrode plate of a capacitive device, and the second metal layer comprises a second electrode plate of the capacitive device; etching the buffer layer, the first insulating layer, the second insulating layer and the third insulating layer located at the bridge area, the opening area and around the opening area until the inorganic barrier layer is exposed; etching the inorganic barrier layer located at the opening area until the organic body layer is exposed; etching the organic body layer located at the opening area with the inorganic barrier layer as a mask to form an opening; forming a third metal layer on one side of the third insulating layer away from the base substrate, wherein the third metal layer comprises a source and a drain of the thin film transistor device that are formed on a surface of the third insulating layer away from the base substrate and connected to the active layer through via holes, a trace formed on a surface of the inorganic barrier layer away from the base substrate and located at the trace area, and the partition wall prefabricated line formed on the surface of the inorganic barrier layer away from the base substrate and disposed around the opening area; and forming a planarization layer on one side of the third metal layer away from the base substrate, wherein the planarization layer comprises a first portion, a second portion and a third portion that are spaced apart from each other, the first portion covers the pixel area and has a via hole extending to the drain, the second portion covers the trace area, and the third portion only covers a surface of the partition wall prefabricated line away from the base substrate.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
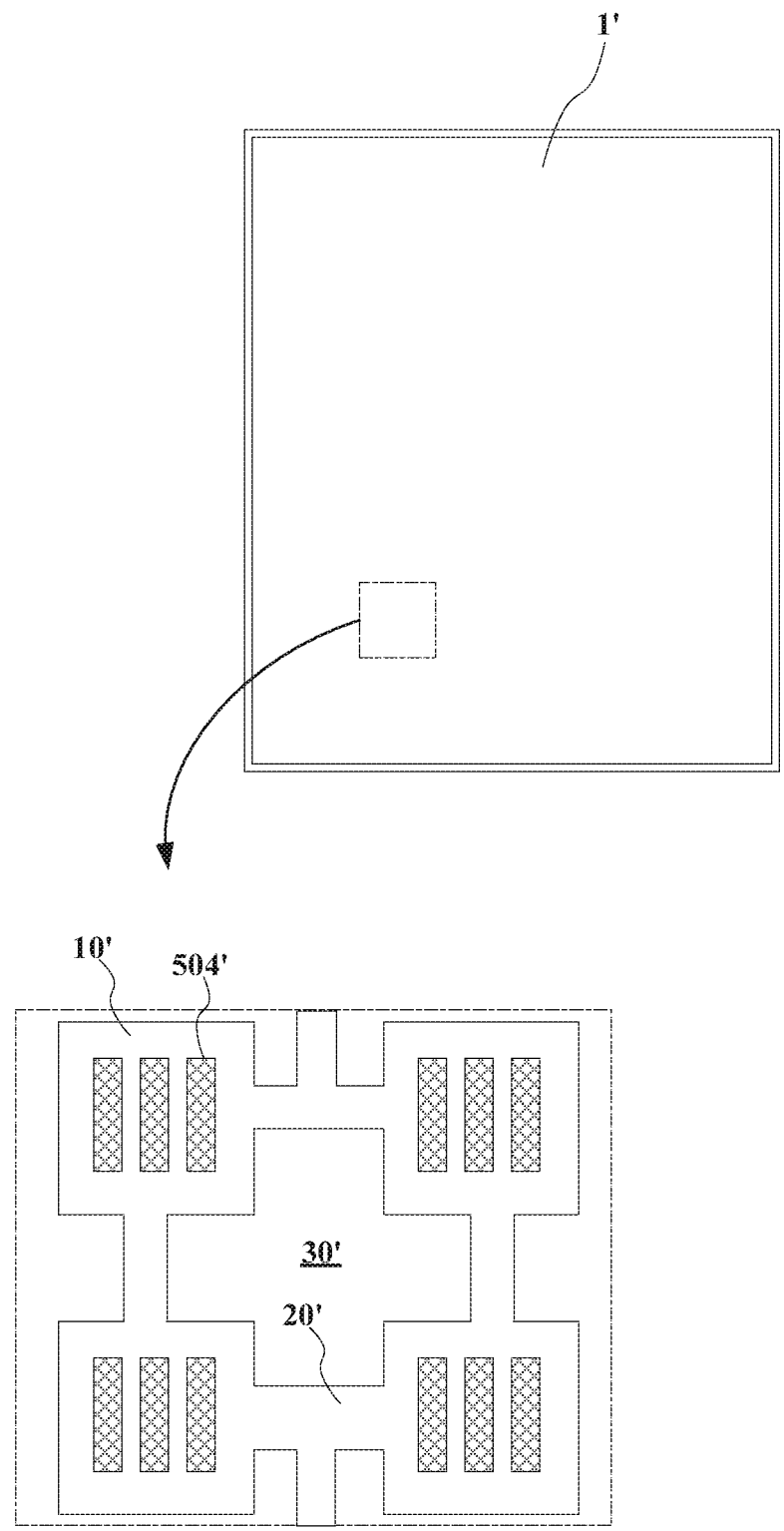
FIG. 1 is a front view of an organic light-emitting display substrate in the related art.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

As shown in FIG. 1, an organic light-emitting display substrate 1' in the related art comprises a plurality of island areas 10' spaced apart by an opening area 30' and a bridge area 20' connected between island areas 10' of the plurality of island areas 10'. The island area 10' is provided with an organic light-emitting device 504', and the bridge area 20' is provided with a trace (not shown). The organic light-emitting display substrate 1' uses a flexible substrate as a base, supplemented by an opening design, so that it is possible to implement curved display, flexible display and even stretched display.

Water and oxygen in the air are the main factors affecting the service life of the organic light-emitting display substrate. Therefore, the organic light-emitting device as well as its related pixel circuit and tracing structure are generally encapsulated and protected by using thin film encapsulation (TFE) technology to prevent water and oxygen from entering. In the structure of the organic light-emitting display substrate, the water and oxygen transmission rate of the organic layer is much higher than that of the inorganic layer, and the opening design in the related art provides a passage for water and oxygen to enter from the organic layer. Therefore, how to prevent water and oxygen from entering inside of the organic light-emitting display substrate, improve the encapsulating performance of the organic light-emitting display substrate, and prolong the service life of the organic light-emitting display device is a technical problem to be solved urgently by those skilled in the art.

In order to solve the above technical problem, the embodiments of the present disclosure provide an organic light-emitting display substrate and a manufacturing method thereof, and an organic light-emitting display device.

Figure 2:
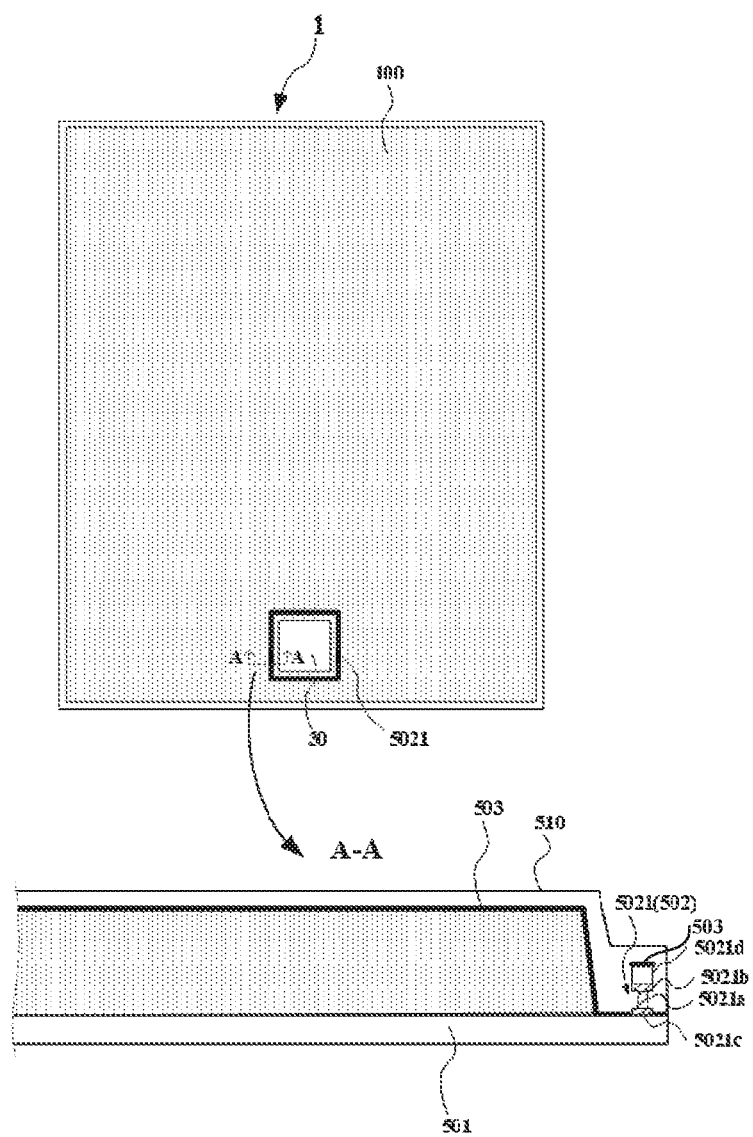
FIG. 2 is a front view and a schematic partial cross-sectional view of an organic light-emitting display substrate according to an embodiment of the present disclosure.

As shown in FIG. 2, the organic light-emitting display substrate 1 provided by an embodiment of the present disclosure comprises a display area 100 and an opening area 30 located at the display area 100. The structure of the display area 100 comprises a base substrate 501, a partition pattern layer 502 located on one side of the base substrate 501, and an organic evaporation layer 503 located on one side of the partition pattern layer 502 away from the base substrate 501.

The partition pattern layer 502 comprises a partition wall 5021 disposed around the opening area 30. The partition wall 5021 comprises a wall portion 5021a and a blocking portion 5021b located on one side of the wall portion 5021a away from the base substrate 501. The orthographic projection of the blocking portion 5021b on the base substrate 501 covers the orthographic projection of the wall portion 5021a on the base substrate 501, and the area of the orthographic projection of the blocking portion 5021b on the base substrate 501 is greater than the area of the orthographic projection of the wall portion 5021a on the base substrate 501.

The organic evaporation layer 503 is discontinuous by being blocked by the partition wall 5021.

In the embodiments of the present disclosure, the base substrate 501 may be a flexible substrate or a rigid substrate and is not limited to a specific type. The partition pattern layer 502 may comprise only one partition wall 5021 disposed around the opening area 30. When the display area is provided with a plurality of opening areas, the partition pattern layer may also comprise a plurality of partition walls of which different partition walls respectively disposed around different opening areas. In the embodiment shown in FIG. 2, the opening area 30 may be used for accommodating functional devices such as a camera or a sensor, and the partition pattern layer 502 comprises one partition wall 5021. In order to realize the encapsulating protection of the internal structure of the organic light-emitting display substrate, the structure of the organic light-emitting display substrate 1 further comprises a thin film encapsulating layer 510.

Figure 3:
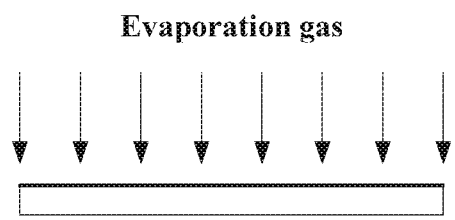
FIG. 3 is a schematic view showing film formation by evaporation.

During the manufacturing of the organic light-emitting display substrate, evaporation process may be used for multiple times. In the evaporation process, an evaporation material is heated under certain vacuum conditions to melt or sublime into vapor comprising atoms, molecules or atomic groups which then condenses to form a film on the surface of the substrate. As shown in FIG. 3, during the evaporation process, the evaporation material forms a film substantially along a normal direction of the substrate. Therefore, the organic evaporation layer 503 in the present disclosure is an organic layer formed by an evaporation process. For example, the organic evaporation layer 503 may be a functional layer of the organic light-emitting device that is formed of an organic material, such as a hole injection layer, an electron injection layer, a hole transport layer, an electron transport layer, an electron blocking layer, a hole blocking layer or a light-emitting layer, etc.

In the related art, the opening design provides the possibility of water and oxygen entering the organic light-emitting device from the opening area through the organic layer, with occasional failure of the organic light-emitting device.

When the organic light-emitting display substrate of the embodiments of the present disclosure is manufactured, the partition pattern layer is formed before the organic evaporation layer is formed. As mentioned above, since the evaporation gas forms a film substantially along a normal direction of the substrate, the blocking portion of the partition wall can effectively block the evaporation gas from forming a film on a wall surface of the partition wall, and the organic evaporation layers on both sides of the partition wall are thereby disconnected and discontinuous. After the substrate is encapsulated by the thin film encapsulating technology, the organic evaporation layer is disconnected at the partition wall, that is, a passage of water and oxygen from the opening area into the organic light-emitting display substrate is cut off. Thus, the encapsulating performance of the organic light-emitting display substrate is improved, and the service life of the organic light-emitting display device is prolonged.

Figure 4:
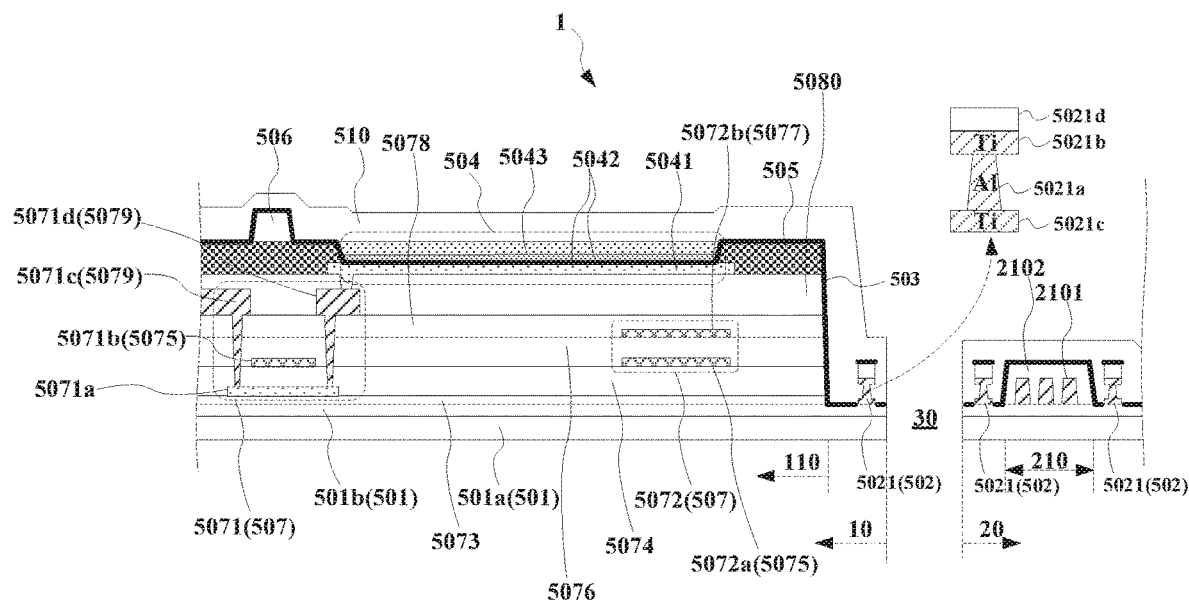
FIG. 4 is a schematic partial cross-sectional view of an organic light-emitting display substrate according to another embodiment of the present disclosure.

As shown in FIG. 4, the organic light-emitting display substrate 1 provided by another embodiment of the present disclosure uses an opening design similar to the related art. The display area comprises a plurality of island areas 10 spaced apart by the opening area 30, and a bridge area 20 connected between island areas 10 (only a partial structure of the bridge area 20 is shown). The island area 10 is provided with a pixel area 110, and the bridge area 20 is provided with a trace area 210. The partition walls 5021 of the partition pattern layer 502 are disposed in the island area 10 and the bridge area 20 and around the opening area 30. Both sides of the partition wall 5021 are spaced from the pixel area 110 and the trace area 210 respectively.

The organic light-emitting display substrate 1 of this embodiment which uses a base substrate 501 supplemented by an opening design, may realize curved display, flexible display and even stretched display. The island area 10, the bridge area 20 and the opening area 30 of the organic light-emitting display substrate 1 are not limited to specific patterns.

As shown in FIG. 4, in this embodiment of the present disclosure, the pixel area 110 of the organic light-emitting display substrate 1 is provided with one or more organic light-emitting devices 504, and the trace area 210 is provided with a trace 2101 to provide a signal transmission passage for the island area 10. The organic light-emitting display substrate 1 may be an active matrix organic light-emitting display substrate shown in the embodiment of FIG. 4. In other embodiments, the organic light-emitting display substrate may also be a passive matrix organic light-emitting display substrate. As shown in FIG. 4, the active matrix organic light-emitting display substrate is further provided with a pixel circuit 507 in the pixel area 110. Each organic light-emitting device 504 is controlled by a pixel circuit 507 to exit light continuously and independently. In order to encapsulate and protect the organic light-emitting device 504 as well as pixel circuit 507 and the trace 2101 of the organic light-emitting display substrate 1, as shown in FIG. 4, the structure of the organic light-emitting display substrate 1 further comprises a thin film encapsulation layer 510 that integrally encapsulate the structure of the island area 10 and the structure of the bridge area 20.

In the embodiments of the present disclosure, the cross-sectional structure of the partition wall may be T-shaped, I-shaped, inverted L-shaped, and so on. It should be noted that, in various embodiments of the present disclosure, the cross section of the partition wall refers to a cross section of the partition wall that passes through the center of the opening area and perpendicular to the base substrate.

In some embodiments of the present disclosure, as shown in FIG. 4, other than the wall portion 5021a and the blocking portion 5021b, the partition wall 5021 also comprises a base portion 5021c located on one side of the wall portion 5021a close to the base substrate 501. In the cross section of the partition wall 5021, the base portion 5021c, the wall portion 5021a, and the blocking portion 5021b form an I-shaped structure. The material of the base portion 5021c is titanium, the material of the wall portion 5021a is aluminum, and the material of the blocking portion 5021b is titanium. Alternatively, the material of the base portion 5021c is molybdenum, the material of the wall portion 5021a is aluminum, and the material of the blocking portion 5021b is molybdenum. During the wet etching process, since the etching rate of aluminum is greater than the etching rates of titanium and molybdenum, the foregoing I-shaped structure of the partition wall 5021 may be formed by wet etching such a multilayer structure with a "sandwich" structure of titanium aluminum titanium or molybdenum aluminum molybdenum, which is simple in process and low in cost. Referring to the step S106 and the step S108 in FIG. 7, in an embodiment, a partition wall prefabricated line 5021" of materials of titanium aluminum titanium or molybdenum aluminum molybdenum is first formed by a dry etching process, and then the foregoing I-shaped structure of the partition wall 5021 is formed by a wet etching process. The foregoing I-shaped structure of the partition wall 5021 may be formed by an independent wet etching process, or synchronously formed in a wet etching process forming other structural layers.

In some embodiments of the present disclosure, as shown in FIG. 4, the partition wall 5021 further comprises a support portion 5021d connected to a surface of the blocking portion 5021b away from the wall portion 5021a. The support portion 5021d may support the blocking portion 5021b to prevent the blocking portion 5021b from collapsing towards the base substrate 501. The support portion 5021d may be formed by an independent patterning process or may be synchronously formed in a patterning process forming other layer structure of the same material as the support portion 5021d. Referring to the step S107 of FIG. 7, in an embodiment, the support portion 5021d is made of an organic material and synchronously formed in the patterning process of the planarization layer 5080 of the organic light-emitting display substrate. Since the support portion 5021d is patterned and only covers the blocking portion 5021b of the foregoing I-shaped structure instead of extending to the section of the opening, the encapsulating performance of the organic light-emitting display substrate 1 will not be affected.

In an embodiment of the present disclosure, the base substrate 501 is a flexible substrate. As shown in FIG. 4, the base substrate 501 comprises an organic body layer 501a and an inorganic barrier layer 501b that are stacked. The partition pattern layer 502 is formed on a surface of the inorganic barrier layer 501b away from the organic body layer 501a, that is, the partition wall 5021 is connected to the inorganic barrier layer 501b. The inorganic barrier layer 501b is made of inorganic material and can be more densely combined with the metal material of the partition wall 5021. Furthermore, the inorganic material has a water and oxygen transmission rate much lower than that of the organic material, and thus can effectively prevent water and oxygen from entering. In addition, the inorganic barrier layer 501b may also prevent impurity particles in the organic body layer 501a from entering the channel area of the active layer 5071a of the thin film transistor device 5071 and affecting the characteristics of the thin film transistor device.

As shown in FIG. 4, in some embodiments of the present disclosure, the organic evaporation layer 503 is a non-patterned organic evaporation layer. Here, the non-patterned organic evaporation layer refers to an organic evaporation layer that does not need to be formed by a patterning process and during manufacturing process of which a mask is not required. The non-patterned organic evaporation layer 503 is, for example, a hole injection layer, an electron injection layer, a hole transport layer, an electron transport layer, an electron blocking layer, or a hole blocking layer of the organic light-emitting device 504. It is worth mentioning that in some embodiments of the present disclosure, the organic evaporation layer 503 may also be an organic evaporation layer that is patterned and forms around the opening area 30 as well. Due to the blocking effect of the partition wall 5021, the organic evaporation layer 503 is discontinuous at the partition wall 5021 and still cut off the entry of water and oxygen.

As shown in FIG. 4, in an embodiment of the present disclosure, other than the organic light-emitting device 504, the pixel area 110 is also provided with a pixel circuit 507. The pixel circuit 507 is located on one side of the organic light-emitting device 504 close to the base substrate 501. The pixel circuit 507 comprises a thin film transistor device 5071 and a capacitive device 5072. The structure of the pixel circuit 507 comprises a buffer layer 5073, an active layer 5071a of the thin film transistor device 5071, a first insulating layer 5074, a first metal layer 5075, a second insulating layer 5076, a second metal layer 5077, a third insulating layer 5078, a third metal layer 5079 and a planarization layer 5080 sequentially disposed along a direction away from the base substrate 501. The first metal layer 5075 comprises a gate 5071b of the thin film transistor device 5071 and a first electrode plate 5072a of the capacitive device 5072. The second metal layer 5077 comprises a second electrode plate 5072b of the capacitive device 5072. The third metal layer 5079 comprises a source 5071c and a drain 5071d connected to the active layer 5071a through via holes. Other than the trace 2101, the trace area 210 is also provided with a trace covering layer 2102 on one side of the trace 2101 away from the base substrate 501.

The structure of the organic light-emitting device 504 of the pixel area 110 comprises an anode 5041, a plurality of functional layers 5042 of organic materials, and a cathode 5043 which are located on one side of the planarization layer 5080 away from the base substrate 501 and sequentially disposed along the direction away from the base substrate 501. A pixel defining layer 505 is further disposed on one side of the planarization layer 5080 away from the base substrate 501. The anodes 5041 of all organic light-emitting devices 504 are spaced by the pixel defining layer 505. The cathodes 5043 of all the organic light-emitting device 504 or the cathodes 5043 of some organic light-emitting devices 504 may be connected to be of a same potential. In this embodiment, the light-emitting layer of the organic light-emitting device 504 needs to be formed by a patterned evaporation process using a mask. In order to support the mask during the evaporation process, as shown in FIG. 4, a spacer layer 506 is further disposed on one side of the pixel defining layer 505 away from the base substrate 501.

In this embodiment, the thin film transistor device 5071 is a low temperature polysilicon (LIPS) thin film transistor device, and is of an electron mobility equal to or more than 200 $cm^2/V*sec$. The area of the thin film transistor device may be effectively reduced, thereby facilitating improving pixel opening rate and reducing power consumption. It is worth mentioning that the thin film transistor device is not limited to a low-temperature polysilicon thin film transistor device, but may also be a semiconductor oxide thin film transistor device, an amorphous silicon thin film transistor device or a microcrystalline silicon thin film transistor device and the like. Different types of thin film transistor devices do not always have the same structure.

In the embodiments of the present disclosure, each layer is not limited to a specific material type. For example, the organic body layer 501a of the base substrate 501 may be made of polyimide material, and the inorganic barrier layer 501b of the base substrate 501, the buffer layer 5073, the first insulating layer 5074, the second insulating layer 5076, and the third insulating layer 5078 may be made of silicon nitride, silicon oxide, or a multilayer materials of silicon nitride and silicon oxide. The planarization layer 5080, the support portion 5021d, the trace covering layer 2102, the pixel defining layer 505, and the spacer layer 506 are organic layers which may be made of resin materials for example. The first metal layer 5075 and the second metal layer 5077 may be made of copper, lead or copper-lead alloy materials. The third metal layer 5079 may be made of multilayer materials of titanium aluminum titanium or multilayer materials of molybdenum aluminum molybdenum. The thin film encapsulation layer 510 may be made of multilayer materials of an inorganic layer, an organic layer, and an inorganic layer. The buffer layer 5073, the first insulating layer 5074, the second insulating layer 5076, and the third insulating layer 5078 which are made of inorganic materials may be patterned by dry etching. The first metal layer 5075, the second metal layer 5077, the third metal layer 5079 and the partition wall prefabricated line 5021" may be patterned by dry etching. The planarization layer 5080, the support portion 5021d, and the trace covering layer 2102, the pixel defining layer 505, and the spacer layer 506 which are made of organic materials may be patterned by exposing and developing the organic materials. The anode 5041 of the organic light-emitting device 504 and the foregoing I-shaped structure of the partition wall 5021 may be patterned by wet etching. More material options and process options will no longer be listed one by one here.

Figure 5:
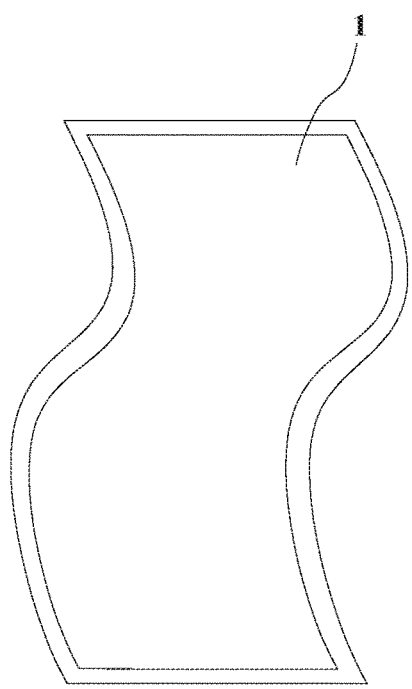
FIG. 5 is a schematic view showing an organic light-emitting display device in a bent state according to an embodiment of the present disclosure.

As shown in FIG. 5, the embodiments of the present disclosure also provide an organic light-emitting display device, comprising the organic light-emitting display substrate 1 according to any of the foregoing embodiments. In some embodiments, the structure of the display panel of the organic light-emitting display device comprises the organic light-emitting display substrate 1 according to any of the foregoing embodiments. Other than the organic light-emitting display substrate 1, the display panel may also comprise structures such as a filter substrate and a polarizer. The organic light-emitting display device may be a curved display device, a flexible display device or a stretchable display device. The organic light-emitting display device is not limited to a specific product type, for example, may be a mobile phone, a tablet computer, a display, a television, a painting screen, an advertising screen, an electronic paper, a smart wear, a vehicle-mounted navigation, and so on.

Figure 6:
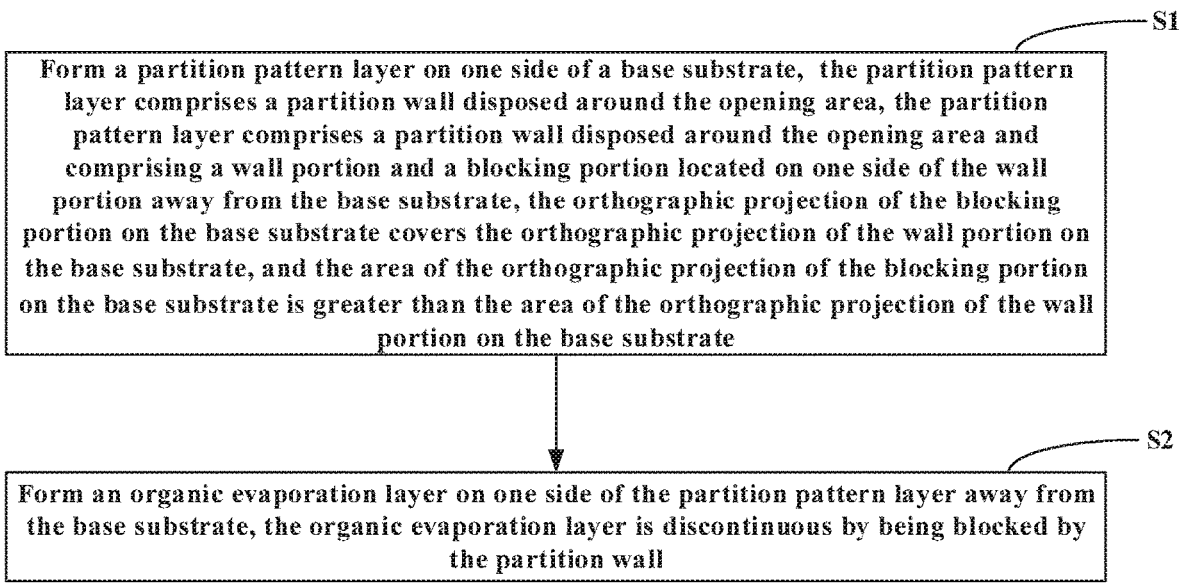
FIG. 6 is a flow chart showing a manufacturing method of an organic light-emitting display substrate according to an embodiment of the present disclosure.

As shown in FIG. 6, the embodiments of the present disclosure also provide a manufacturing method of an organic light-emitting display substrate. The organic light-emitting display substrate to be manufactured comprises a display area and an opening area located at the display area. The manufacturing method of the organic light-emitting display substrate comprises the following steps.

Step S1: a partition pattern layer is formed on one side of the base substrate. The partition pattern layer comprises a partition wall disposed around the opening area and comprising a wall portion and a blocking portion located on one side of the wall portion away from the base substrate. The orthographic projection of the blocking portion on the base substrate covers the orthographic projection of the wall portion on the base substrate, and the area of the orthographic projection of the blocking portion on the base substrate is greater than the area of the orthographic projection of the wall portion on the base substrate.

Step S2: an organic evaporation layer is formed on one side of the partition pattern layer away from the base substrate, the organic evaporation layer is discontinuous by being blocked by the partition wall.

At step S2, during the process of forming the organic evaporation layer by evaporation process, the blocking portion of the partition wall can effectively block the evaporation gas from forming a film on a wall surface of the wall portion of the partition wall, so that the organic evaporation layer is discontinuous at the partition wall. After the substrate is encapsulated by using thin film encapsulating technology, since the organic evaporation layer is partitioned at the partition wall, a passage of water and oxygen entering inside of the substrate from the opening area is cut off. Thus, the encapsulating performance of the organic light-emitting display substrate is improved, and the service life of the organic light-emitting display device is prolonged.

The above manufacturing method may be used to manufacture the organic light-emitting display substrate as shown in FIG. 2.

In an embodiment of the present disclosure, the above manufacturing method is used to manufacture the organic light-emitting display substrate as shown in FIG. 3. The display area of the organic light-emitting display substrate comprises a plurality of island areas spaced by the opening area and a bridge area connected between island areas. The island area is provided with a pixel area and the bridge area is provided with a trace area. In the manufacturing method of the organic light-emitting display substrate in this embodiment, at step S1, the foregoing partition wall disposed around the opening area is formed on one side of the base substrate. Both sides of the partition wall are spaced from the pixel area and the trace area respectively.

In the embodiment shown in FIG. 3 of the present disclosure, the partition wall further comprises a base portion located on one side of the wall portion close to the base substrate. In the cross section of the partition wall that passes through a center of the opening area and is perpendicular to the base substrate, the base portion, the wall portion and the blocking portion form an I-shaped structure. In the step S1 of this embodiment, a partition wall prefabricated line is formed by dry etching on one side of the base substrate, and the foregoing I-shaped structure of the partition wall is formed by wet etching the partition wall prefabricated line. The partition wall prefabricated line comprises a titanium layer, an aluminum layer and a titanium layer sequentially disposed along the direction away from the base substrate, or the partition wall prefabricated line comprises a molybdenum layer, an aluminum layer and a molybdenum layer sequentially disposed along the direction away from the base substrate.

In an embodiment of the present disclosure, the foregoing I-shaped structure of the partition wall is formed in the wet etching process forming the anode of the organic light-emitting device located at the pixel area.

Figure 7:
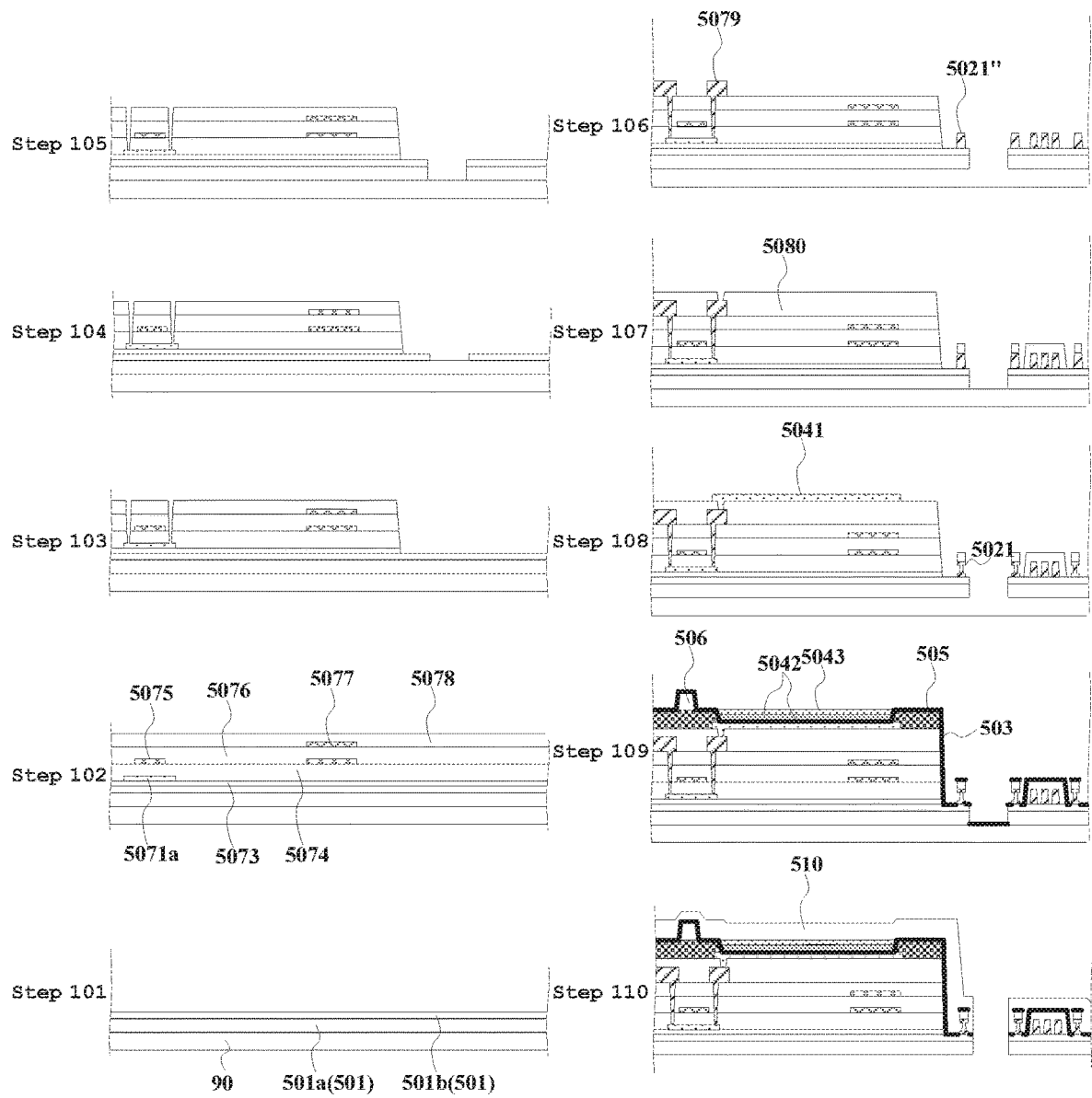
FIG. 7 is a schematic view showing a manufacturing process of an organic light-emitting display substrate according to an embodiment of the present disclosure.

As shown in FIG. 7, which is a schematic view showing a manufacturing process of an organic light-emitting display substrate according to an embodiment. In conjunction with FIG. 7 and FIG. 4, the production process comprises the following steps.

Step S101: a base substrate is formed on a glass substrate. For example, an organic body layer is formed on the glass substrate and an inorganic barrier layer is formed on the surface of the organic body layer. The organic body layer and the inorganic barrier layer serve as the base substrate of the organic light-emitting display substrate. The glass substrate only produces a supporting effect in the manufacturing process of the organic light-emitting display substrate. After the production of the structure of the organic light-emitting display substrate is completed, the glass substrate is peeled from the base substrate, so that the flexible characteristics of the organic light-emitting display substrate is realized.

Step S102: a buffer layer, an active layer of a thin film transistor, a first insulating layer, a first metal layer, a second insulating layer, a second metal layer, and a third insulating layer are sequentially formed on one side of the base substrate where the inorganic barrier layer is provided. The buffer layer, the first insulating layer, the second insulating layer and the third insulating layer are spread over the island area and the bridge area. The active layer, the first metal layer and the second metal layer are located at the pixel area. The first metal layer comprises a gate of the thin film transistor and a first electrode plate of the capacitive device, and the second metal layer comprises a second electrode plate of the capacitive device. In this step, for the material selection and process selection of each layer, reference may be made to the description of the foregoing embodiments.

Step S103: the buffer layer, the first insulating layer, the second insulating layer and the third insulating layer located at the bridge area, the opening area and around the opening area are etched until the inorganic barrier layer is exposed. A dry etching process may be used to etch the inorganic material.

Step S104: the inorganic barrier layer located at the opening area is etched, for example, dry etched until the organic body layer is exposed.

Step S105: the organic body layer located at the opening area is etched with the inorganic barrier layer as a mask to form an opening. The organic body layer located at the opening area may be etched with the inorganic barrier layer as a mask by using an oxygen plasma dry etching technology.

Step S106: a third metal layer is formed on one side of the third insulating layer away from the base substrate. The third metal layer comprises a source and a drain of the thin film transistor device formed on a surface of the third insulating layer away from the base substrate and connected to the active layer through via holes, a trace formed on a surface of the inorganic barrier layer away from the base substrate and located at the trace area, and a partition wall prefabricated line formed on a surface of the inorganic barrier layer away from the base substrate and disposed around the opening area. The third metal layer is patterned by dry etching, and the formed partition wall prefabricated line is a stacked structure of titanium aluminum titanium or molybdenum aluminum molybdenum, and the foregoing I-shaped structure has not yet been formed.

Step S107: a planarization layer is formed on one side of the third metal layer away from the base substrate. The planarization layer comprises a first portion, a second portion, and a third portion that are spaced apart from each other. The first portion covers the pixel area and has a via hole extending to the drain. The second portion covers the trace area, and the third portion only covers a surface of the partition wall prefabricated line away from the base substrate. The planarization layer may be patterned by exposure and development.

Step S108: an anode of the organic light-emitting device located at the pixel area is formed on one side of the planarization layer away from the base substrate. The anode is connected to the drain of the thin film transistor device through a via hole. Since the anode is typically made of indium tin oxide material with high work function, or multilayer materials of indium tin oxide, silver, and indium tin oxide, which are suitable for patterning by wet etching, the foregoing I-shaped structure of the partition wall may be synchronously formed in the wet etching process forming the anode.

Step S109: a pixel defining layer, a spacer layer, functional layers of the organic light-emitting device and a cathode and the like are formed on one side of the planarization layer away from the base substrate. Some functional layers of the organic light-emitting device, such as a hole injection layer, an electron injection layer, a hole transport layer, an electron transport layer, an electron blocking layer, and a hole blocking layer, may be formed by a non-patterned evaporation process.

Step S110: the island area and the bridge area are encapsulated integrally, and the glass substrate is peeled off. When the glass substrate is peeled off, the organic evaporation layer and the encapsulation layer located at the opening area are taken away at the same time to form a through hole.

After the island area and the bridge area structure are encapsulated integrally by thin film encapsulating technology, the non-patterned functional layer of the organic light-emitting device is blocked at the partition wall, a passage of water and oxygen from the opening area to the substrate is cut off. The encapsulating performance of the organic light-emitting display substrate is improved, and the service life of the organic light-emitting display device is prolonged.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. An organic light-emitting display substrate, comprising a display area and an opening area located at the display area, wherein the display area comprises:

a base substrate;

a partition pattern layer located on one side of the base substrate and comprising a partition wall disposed around the opening area, wherein the partition wall comprises a wall portion and a blocking portion located on one side of the wall portion away from the base substrate, an orthographic projection of the blocking portion on the base substrate covers an orthographic projection of the wall portion on the base substrate, and an area of the orthographic projection of the blocking portion on the base substrate is greater than an area of the orthographic projection of the wall portion on the base substrate; and an organic evaporation layer located on one side of the partition pattern layer away from the base substrate, wherein the organic evaporation layer is discontinuous by being blocked by the partition wall;

wherein the display area comprises a plurality of island areas spaced by the opening area, and a bridge area connected between adjacent island areas of the plurality of island areas, wherein each of the plurality of island areas is provided with a pixel area, and the bridge area is provided with a trace area, and wherein the partition wall is disposed in each of the plurality of island areas and the bridge area, and the partition wall in the bridge area is between the opening area and the trace area.

2. The organic light-emitting display substrate according to claim 1, wherein the partition wall further comprises a base portion located on one side of the wall portion close to the base substrate, and in a cross section of the partition wall passing through a center of the opening area and perpendicular to the base substrate, the base portion, the wall portion and the blocking portion form an I-shaped structure.

3. The organic light-emitting display substrate according to claim 2, wherein a material of the base portion is titanium, a material of the wall portion is aluminum, and a material of the blocking portion is titanium.

4. The organic light-emitting display substrate according to claim 2, wherein a material of the base portion is molybdenum, a material of the wall portion is aluminum, and a material of the blocking portion is molybdenum.

5. The organic light-emitting display substrate according to claim 1, wherein the partition wall further comprises a support portion connected to a surface of the blocking portion away from the wall portion.

6. The organic light-emitting display substrate according to claim 1, wherein the base substrate is a flexible substrate, and comprises an organic body layer and an inorganic barrier layer that are stacked, and the partition pattern layer is disposed on a surface of the inorganic barrier layer away from the organic body layer.

7. The organic light-emitting display substrate according to claim 1, wherein the organic evaporation layer is a non-patterned organic evaporation layer.

8. The organic light-emitting display substrate according to claim 1, wherein the pixel area is provided with an organic light-emitting device, and the organic evaporation layer comprises a non-patterned functional layer of the organic light-emitting device.

9. The organic light-emitting display substrate according to claim 8, wherein the pixel area is further provided with a pixel circuit located on one side of the organic light-emitting device close to the base substrate, and comprising a thin film transistor device and a capacitive device, the pixel circuit comprising:

a buffer layer, an active layer of the thin film transistor device, a first insulating layer, a first metal layer, a second insulating layer, a second metal layer, a third insulating layer, a third metal layer and a planarization layer that are sequentially disposed along a direction away from the base substrate, wherein the first metal layer comprises a gate of the thin film transistor device and a first electrode plate of the capacitive device, the second metal layer comprises a second electrode plate of the capacitive device, and the third metal layer comprises a source and a drain that are connected to the active layer through via holes.

10. The organic light-emitting display substrate according to claim 8, wherein the trace area is provided with a trace and a trace covering layer located on one side of the trace away from the base substrate.

11. An organic light-emitting display device, comprising the organic light-emitting display substrate according to claim 1.

12. A manufacturing method of an organic light-emitting display substrate, the organic light-emitting display substrate comprising a display area and an opening area located at the display area, the manufacturing method comprising:
forming a partition pattern layer, on one side of a base substrate, comprising a partition wall disposed around the opening area, wherein the partition wall comprises a wall portion and a blocking portion located on one side of the wall portion away from the base substrate, an orthographic projection of the blocking portion on the base substrate covers an orthographic projection of the wall portion on the base substrate, and an area of the orthographic projection of the blocking portion on the base substrate is greater than an area of the orthographic projection of the wall portion on the base substrate; and
forming an organic evaporation layer on one side of the partition pattern layer away from the base substrate, wherein the organic evaporation layer is discontinuous by being blocked by the partition wall;
wherein the display area comprises a plurality of island areas spaced by the opening area, and a bridge area connected between adjacent island areas of the plurality of island areas, wherein each of the plurality of island areas is provided with a pixel area, and the bridge area is provided with a trace area, and
wherein the partition wall is disposed in each of the plurality of island areas and the bridge area, and the partition wall in the bridge area is between the opening area and the trace area.

13. The manufacturing method according to claim 12, wherein:
the partition wall further comprises a base portion located on one side of the wall portion close to the base substrate, and in a cross section of the partition wall passing through a center of the opening area and perpendicular to the base substrate, the base portion, the wall portion and the blocking portion form an I-shaped structure; and
forming the partition pattern layer on the one side of the base substrate comprises:
forming a partition wall prefabricated line by dry etching on the one side of the base substrate, wherein the partition wall prefabricated line comprises a titanium layer, an aluminum layer and a titanium layer that are sequentially disposed along a direction away from the base substrate; or the partition wall prefabricated line comprises a molybdenum layer, an aluminum layer and a molybdenum layer that are sequentially disposed along the direction away from the base substrate, and
wet etching the partition wall prefabricated line to form the I-shaped structure of the partition wall.

14. The manufacturing method according to claim 13, wherein the pixel area is provided with an organic light-emitting device, and the I-shaped structure of the partition wall is formed in a wet etching process forming an anode of the organic light-emitting device.

15. The manufacturing method according to claim 14, wherein, before the I-shaped structure of the partition wall and the anode of the organic light-emitting device are formed, the manufacturing method further comprises:
forming an inorganic barrier layer on a surface of an organic body layer to form the base substrate;
forming a buffer layer, an active layer of a thin film transistor device, a first insulating layer, a first metal layer, a second insulating layer, a second metal layer and a third insulating layer sequentially on one side of the base substrate where the inorganic barrier layer is provided, wherein the buffer layer, the first insulating layer, the second insulating layer and the third insulating layer are spread over the plurality of island areas and the bridge area, the active layer, the first metal layer and the second metal layer are located at the pixel area, the first metal layer comprises a gate of the thin film transistor device and a first electrode plate of a capacitive device, and the second metal layer comprises a second electrode plate of the capacitive device;
etching the buffer layer, the first insulating layer, the second insulating layer and the third insulating layer located at the bridge area, the opening area and around the opening area until the inorganic barrier layer is exposed;
etching the inorganic barrier layer located at the opening area until the organic body layer is exposed;
etching the organic body layer located at the opening area with the inorganic barrier layer as a mask to form an opening;
forming a third metal layer on one side of the third insulating layer away from the base substrate, wherein the third metal layer comprises a source and a drain of the thin film transistor device that are formed on a surface of the third insulating layer away from the base substrate and connected to the active layer through via holes, a trace formed on a surface of the inorganic barrier layer away from the base substrate and located at the trace area, and the partition wall prefabricated line formed on the surface of the inorganic barrier layer away from the base substrate and disposed around the opening area; and
forming a planarization layer on one side of the third metal layer away from the base substrate, wherein the planarization layer comprises a first portion, a second portion and a third portion that are spaced apart from each other, the first portion covers the pixel area and has a via hole extending to the drain, the second portion covers the trace area, and the third portion only covers a surface of the partition wall prefabricated line away from the base substrate.

* * * * *